(12) United States Patent
Chou

(10) Patent No.: US 6,248,601 B1
(45) Date of Patent: Jun. 19, 2001

(54) FIX THE GLASSIVATION LAYER'S MICRO CRACK POINT PRECISELY BY USING ELECTROPLATING METHOD

(75) Inventor: Ming-Chun Chou, Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/293,722

(22) Filed: Apr. 19, 1999

(51) Int. Cl.$^7$ .................................................. G01R 31/26
(52) U.S. Cl. ............................................. 438/14; 324/760
(58) Field of Search .......................... 324/760; 438/286, 438/981, 14

(56) References Cited

U.S. PATENT DOCUMENTS

| | | |
|---|---|---|
| 3,719,884 | 3/1973 | Laroche .................................. 324/54 |
| 4,019,129 | 4/1977 | Grau ...................................... 324/30 R |
| 4,180,439 | 12/1979 | Deines et al. ......................... 204/1 T |
| 4,514,436 | 4/1985 | Moerschel .............................. 427/10 |
| 4,599,241 | 7/1986 | Nakaboh et al. ......................... 427/8 |
| 4,919,766 | 4/1990 | Kotowski et al. ................. 204/153.1 |
| 5,076,906 | 12/1991 | Der Marderosian, Jr. ........ 204/153.1 |
| 5,654,560 | * 8/1997 | Nishizawa ............................. 257/139 |
| 5,917,211 | * 6/1999 | Murata ................................. 257/296 |
| 5,966,022 | * 10/1999 | Budnaitis ............................. 324/760 |
| 6,037,619 | * 3/2000 | Morizuka ............................. 257/280 |
| 6,054,730 | * 4/2000 | Noguchi ................................ 257/306 |

\* cited by examiner

*Primary Examiner*—John F. Niebling
*Assistant Examiner*—Andre C Stevenson
(74) *Attorney, Agent, or Firm*—George O. Saile; Stephen B. Ackerman

(57) ABSTRACT

A cathode-anode apparatus is constructed whereby the wafer under test, connected to a conducting wire, forms the cathode terminal and a copper plate, also connected to a conducting wire, forms the anode terminal. The wafer under test and the copper plate are immersed in a $CuSO_4$—$H_2O$ solution. A positive dc voltage is applied to the copper plate, the dc current ionizes the $CuSO_4$ solution and forms $Cu^{2+}$ ions. These $Cu^{2+}$ ions will diffuse to the wafer surface. Defects in the glassification surface will absorb most of the $Cu^{2+}$ ions, concentrations of $Cu^{2+}$ ions will therefore from around these defects.

4 Claims, 2 Drawing Sheets

FIX THE GLASSIVATION LAYER'S MICRO CRACK POINT PRECISELY BY USING ELECTROPLATING METHOD

BACKGROUND OF THE INVENTION (1) Field of the Invention

The invention relates to the fabrication of integrated circuit devices, and, more particularly, to a method to detect pinholes in dielectric layers (or other glassivation layers such as passivation layers) by using electroplating.

(2) Description of the Prior Art

Glassification layers in the structure of a semiconductor device serve the purpose of protecting active device regions of an integrated circuit. Examples of glassification layers are dielectric layers, passivation layers, insulating encapsulation layers overlying electrical circuits and in general thin material films that are used for the manufacturing of semiconductor devices.

Imperfections that occur in these glassification layers can lead to shorts or unacceptably low breakdown voltages between different conductor levels. These imperfections can take the form of pinholes or weak spots that can be caused by a variety of reasons such as poor planarity of the underlying layer, poor alignment of the patterns during successive processes of patterning, high level of particulates in the processing environment, uneven distribution of deposited materials such as photoresist over device features that have regions of high angularity such as sharp corners, issues related to line coverage due to poor topography definition causing line thinning or opens in metal lines.

Glassification problems can be of particular devastating effect where they occur in Poly-Metal interlevel Dielectrics (PMD) or in Inter-Level Dielectric (ILD) layers. Electromigration, the phenomenon where ions of a conductor are re-located in the direction of the conducting current within a metal conductor, is also a frequently cited cause for surface defects. Electromigration causes an uneven distribution of ions within the metal conductor; this uneven distribution can lead to ion voids, which can result in open circuit failure of the metal conductor. Electromigration can, by its very nature, occur in any surface where electrical current is conducted, including metal contact areas.

Undesirable surface material distribution can have many causes. For instance stress related impact between overlying dielectric layers or different coefficients of thermal expansion between layers of material that are in contact with each other. It is apparent that, for micron and submicron devices, the impact of glassification problems becomes, due to the relative size of the glassification areas and irregularities, even more severe.

Numerous approaches and solutions have been proposed and implemented to eliminate or alleviate these occurrences of glassification such as using and matching materials according to their compressive values, adding certain elements to glassification layers to reduce the formation of weak spots in the surface of the layer, applying multiple layers where the interaction of these layers from a thermal and stress creating point of view are understood and matched, applying techniques during the formation of the glassification layers that minimize the probability of weak spots being created by for instance using a temperature profile of the glassification layer during its deposition, reducing angular features or adopting special processing techniques to eliminate areas where the uniform deposition of a layer can be questioned.

Where weak spots in glassification layer are of an extreme nature to the point where openings in a the glassification layer occur, the underlying layer may be exposed. The underlying layer can, as a consequence, form an oxidation layer on its surface or can be further exposed to contaminants. Corrosion of the underlying layer, such as conducting lines, may also occur.

It is clear from the above that the problem of weak spots and pinholes in glassification layers requires detailed attention. This implies that dependable, cheap methods must be available to detect such weak spots and pinholes so that remedial action can be taken to either eliminate these areas or to eliminate any negative effect that these areas might have on device yield and reliability.

Due to the microscopic nature of many of the indicated defects, it is also a requirement that any device or method of detection have great accuracy in locating the defect. The impact that the identification of a defect has on the manufacturing cycle must also be held to a minimum which means that the method used to identify these defects must not be time consuming.

A number of methods have been proposed and are in use for the localization of defects. Some of these methods combine chemical deposition on the glassification surface with electrical analysis of the surface after the chemical reaction has taken place. Other methods teach the deposition of chemical elements over the glassification layer whereby these elements cause chemical or electrochemical reactions with the layer in such a manner that any defects in the glassification layer are highlighted and are made visible for further analysis.

One previous method for identifying weak spots or pinholes in the glassification layer is by submerging the wafer that is being tested into a dish that contains a solution of DI water and isopropyl alcohol (IPA). A dc voltage of about 15 volt is applied to the dish; this voltage is applied between the body of the dish and the wafer under test so that dc current flows between the wafer and the dish. The surface of the glassification layer is, during the time that the dc current flows, observed with a microscope where bubbles emanating from the glassification surface indicate the formation of hydrogen and therefore the presence of surface weak spots or pinholes. This method has two major disadvantages: it is difficult to determine the exact location of the identified defect after the wafer under test is removed from the dish while this wafer analysis is time consuming.

U.S. Pat. No. 3,719,884 (Laroche) shows a method and apparatus to find pinholes by electroplating a component (varnish) and measuring the current consumed. The prior art section describes electroplating defect/pinholes with Cu to visually mark the defect. This is extremely close to the invention.

U.S. Pat. No. 5,076,906 (Dermarderosian, Jr.) teaches a method for testing pinholes in dielectric layers (glassivation) by using electrolyte test and by looking for gas bubbles. This is close to the invention, but does not claim electroplating specifically.

U.S. Pat. No. 4,514,436 (Moerschel) "Methods of highlighting pinholes in a surface layer of an article" shows a method of highlighting pinholes in a surface layer (37), such as a photoresist layer, of an article (31), such as a semiconductor wafer, using an electrolytic treatment step. The electrolytic treatment process dissolves the photoresist around each of the pinholes. The resulting enlarged areas (46) of missing photoresist around each of the pinholes are readily recognized by visual inspection of the wafer (31) at the conclusion of the electrolytic treatment.

U.S. Pat. No. 4,919,766 (Kotowski et al.) shows an etching technique for locating defects.

U.S. Pat. No. 4,180,439 (Deines et al.) teaches a method to anodic etch active defects in a silicon wafer.

U.S. Pat. No. 4,019,129 teaches a method of scanning the glassification surface by using the glassification surface as an anode and subsequently and sequentially energizing a coordinate array of cathode conductors. The conductive current occurring between the anode and cathode indicates the absence or presence of surface irregularities in the glassification layer.

U.S. Pat. No. 4,599,241 teaches the deposition on the surface of the glassification layer a layer of reactive material and further identifying any existing weak spots or pin holes by chemical treatments of the reactive material.

SUMMARY OF THE INVENTION

A principle objective of the invention is to locate defects in a glassification layer.

It is another objective of the invention to rapidly locate defects in a glassification layer.

It is another objective of the invention is to locate defects in a glassification layer by using an Optical Microscope.

In accordance with the objectives of the invention a new method is provided to locate defects in a glassification layer. A battery like arrangement of cathode-anode is constructed whereby the wafer under test, connected to a conducting wire, forms the cathode terminal and a copper plate, also connected to a conducting wire, forms the anode terminal. The surface area of the wafer under test that needs to be analyzed for defects and the copper plate are immersed in a $CuSO_4$—$H_2O$ solution. A positive dc voltage is applied to the copper plate (the anode), dc current flows from the anode (the copper plate) to the cathode (the wafer under test). The dc current ionizes the $CuSO_4$ solution and forms $Cu^{2+}$ ions. These $Cu^{2+}$ ions will diffuse, due to the dc voltage difference between the cathode and the anode plate, to the immersed surface of the wafer under test. Where no defects are present in the surface of the glassification layer, normal electroplating of that surface will take place. Defects in the glassification surface are areas of low electric resistance where normal electroplating will not take place. Due to their low electric resistance, electric current will concentrate in the defect areas; $Cu^{2+}$ ions will therefore accumulate around the defective areas in the glassification layer. These accumulations of $Cu^{2+}$ ions will remain in place after the wafer under test is removed from the immersion bath, analyses of the wafer under test can now proceed quickly and effectively since the accumulated $Cu^{2+}$ ions on the surface of the wafer under test provide a clear indication as to the presence of defects in the glassification layer.

DESCRIPTION OF THE PREFERRED EMBODIMENTS

Figure 1:
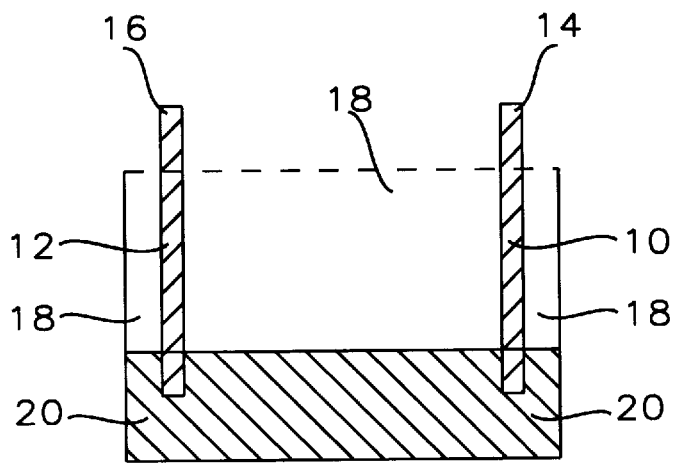
FIG. 1 shows a cross section of the test arrangement for the wafer under test.

Referring now specifically to FIG. 1, there is shown a cross section of a vat or container 18 wherein a solution 20 of $CuSO_4$—$H_2O$ has been deposited. Copper plate 12 is partially immersed into the $CuSO_4$—$H_2O$ solution 20, the surface area of the wafer 10 that needs to be analyzed is also immersed into the $CuSO_4$—$H_2O$ solution. The wafer 10 that needs to be analyzed can be partially or completely immersed into the $CuSO_4$—$H_2O$ solution 20, in most practical applications partial immersion will suffice since this partial immersion allows for locating suspected or questionable areas of the wafer under test. Copper plate 12 is connected to a conducting line 16 while the wafer under test 10 is connected to a conducting line 14. A positive dc voltage is applied to conducting line 16; a negative or ground voltage is applied to the conducting line 14. This application of the dc voltage makes the copper plate 12 from an electrical point of view the anode terminal while the wafer under test 10 functions as the cathode terminal. A dc current will therefore flow from the positive (anode) terminal 12 to the negative (cathode) terminal 10. This dc current will ionize the copper in the $CuSO_4$—$H_2O$ solution and in doing so will create $Cu^{2+}$ ions. These $Cu^{2+}$ ions will, due to the voltage differential between the anode and the cathode, diffuse to the cathode and will, when reaching the cathode (that is the surface of the wafer under test 10), be deposited on the cathode surface. Where no defects are present in the surface of the glassification layer, normal electroplating of that surface will take place. Defects in the glassification surface are areas of low electric resistance where normal electroplating will not take place. Due to their low electric resistance, electric current will concentrate in the defect areas; $Cu^{2+}$ ions will therefore accumulate around the defective areas in the glassification layer. Where severe glassification surface defects are present, the $Cu^{2+}$ ions will penetrate the surface of the wafer under test. The $Cu^{2+}$ ions will, after sufficient penetration has been completed, accumulate further around the surface area around the areas of defect and will, in so doing, identify these areas for further analysis.

The level of the dc voltage that is applied between the anode and the cathode is application dependent; a range of values that is expected to be suitable ranges from 10 to 25 volt dc. The basic principle of the invention rests on the movement of suspended particles, the $Cu^{2+}$ ions, through a fluid under the action of an electromotive force applied to electrons in contact with the suspension (electrophoresis). The amount of material deposited at the electrodes during electrophoresis is directly proportional to the current that is passed between the electrodes. The current conducted through the $CuSO_4$—$H_2O$ solution is proportional to the surface area of the surface defects, the larger the area of the surface defects the larger the current needs to be in order to highlight the defects. Other factors need to be considered in determining the dc voltage applied to the electrodes such as the renewal rate and condition of the $CuSO_4$—$H_2O$ solution since this determines the $Cu^{2+}$ ion concentration and therefore the accumulation of $Cu^{2+}$ ions in the areas of surface defects. The current passed through the solution also depends on the time duration of the application of this current since, while the current is being applied, electrical conditions of conductivity change due to the build up of $Cu^{2+}$ ions on the surface of the wafer and due to $Cu^{2+}$ ions depletion in the $CuSO_4$—$H_2O$ solution. Since the principle objective of the invention is to detect and identify surface defects, it may not be of critical importance to specify exactly the quantity of the $Cu^{2+}$ ions that accumulate around the areas of defects. Where it is of importance to differentiate between defects and to identify the degree or size of the defects, a clear correlation must be established between the accumulated quantity of the $Cu^{2+}$ ions and the above highlighted operational parameters that effect this accumulation. It may in this respect be of importance to specify the application of the voltage between the electrodes for a time duration that extends to the point where the current flowing between the electrodes has decreased to a very low value. This in order to assure that the conditions of deposition of $Cu^{2+}$ ions are well defined and that, as a consequence, concrete conclusions can be drawn as to the nature and extent of the defect. The operational conditions under which the invention is implemented may therefore differ from application to application and must, for each application, be experimentally determined under strict and precise control and definition of the processing parameters such as voltage applied between the electrodes, $CuSO_4$—$H_2O$ solution concentrations, distance between the electrodes, $CuSO_4$—$H_2O$ solution renewal frequency and ambient temperature.

Although the time during which the wafer under test is immersed in the $CuSO_4$—$H_2O$ solution is also application dependent, it is expected that, for most applications, a time of no more than 30 seconds is adequate to identify defects in the glassification layer.

Figure 2A:
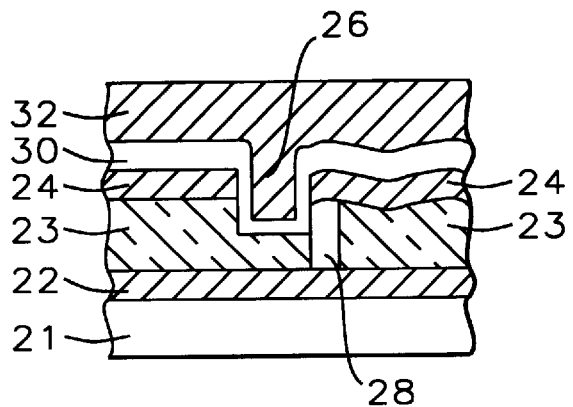
FIG. 2 shows a cross section of a pinhole and of copper accumulated around the pinhole.

FIG. 2 shows a cross section of two glassification surface defects. FIG. 2a shows a cross section of two layers of metal, that is layer 22 of metal 1 and layer 24 of metal 2. The metal layers have been deposited on the surface of a semiconductor substrate 21, a dielectric layer 23 separates the layers of metal. A pinhole 28 has occurred between the two layers of metal, as a consequence of the pin hole 28 a crack 26 has developed in the overlaying glassification layer 30. Layer 32 is the layer of accumulated copper under the invention. It is clear that the copper first fills the pinhole 26 after which, if the process of electroplating is continued, the copper further accumulates on the surface of the glassification layer in the area immediately adjacent to the pinhole.

Figure 2B:
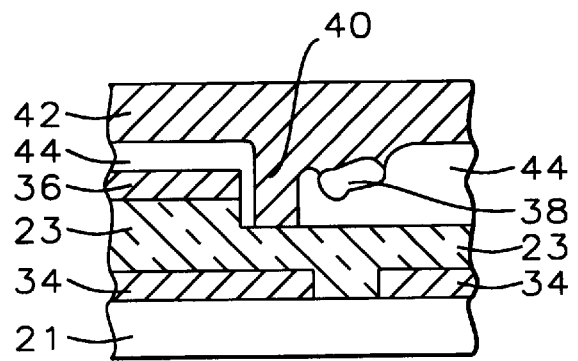

FIG. 2b shows a cross section of two layers of metal, that is layer 34 of metal 1 and layer 36 of metal 2. The layers of metal have been deposited on the surface of a substrate 21, a dielectric layer 23 separates the layers of metal. A dislocation 38 in the glassification layer 44 has caused the formation of a pinhole 40 in the glassification layer. Layer 42 is the accumulated layer of copper according to the invention. It is clear that the copper first fills the pinhole 40 after which, if the process of electroplating is continued, the copper further accumulates on the surface of the glassification layer 44 in the area immediately adjacent to the pinhole 40, thus identifying the location of the pinhole.

Figure 3:
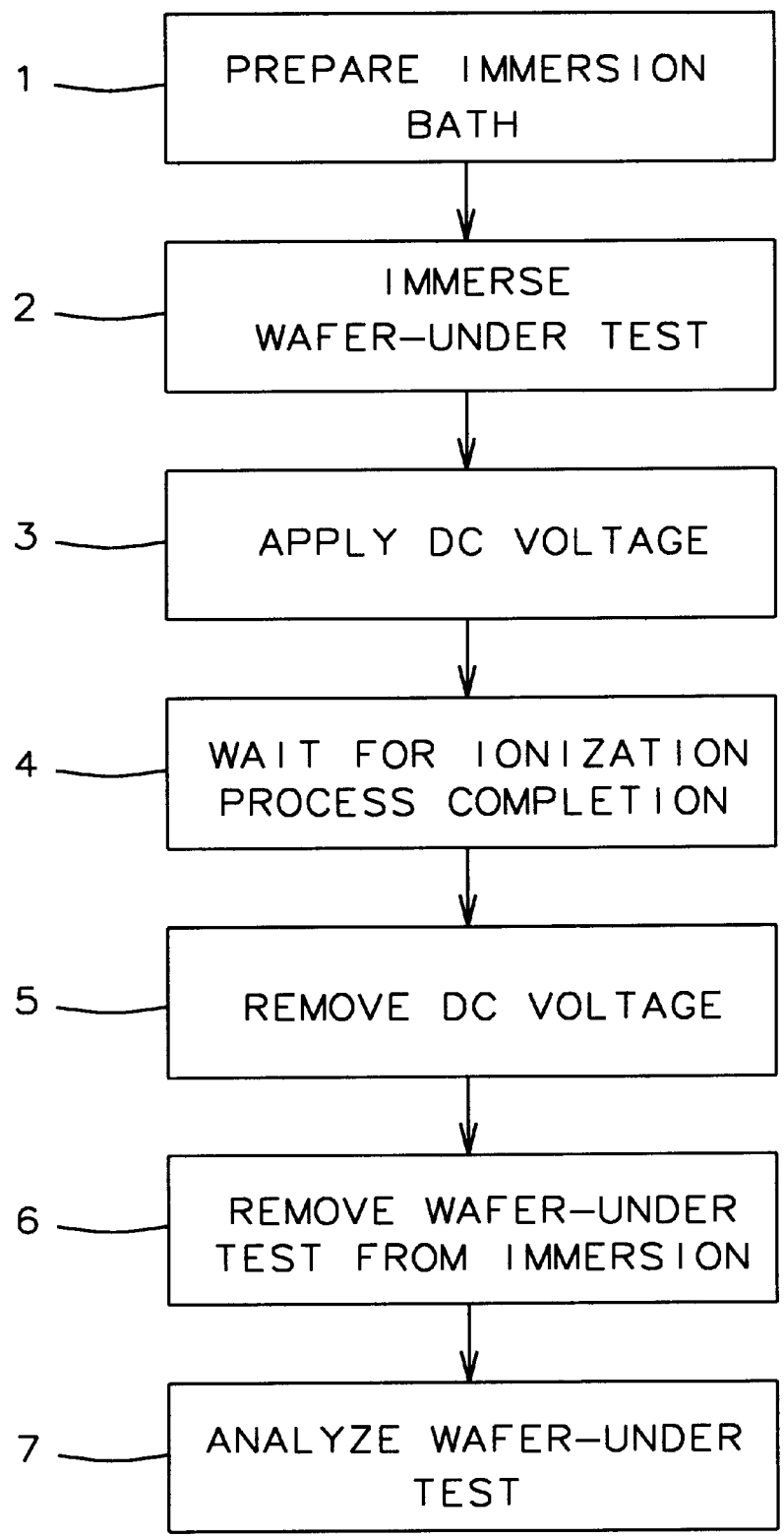
FIG. 3 shows the operational sequence for the analysis of a wafer under test using the invention.

FIG. 3 shows a flow chart of the operational sequence for the implementation of the invention. Step 1 indicates the preparation of the container for the immersion of the copper plate and the wafer under test. The container is filled with the $CuSO_4$—$H_2O$ solution, electrical wires are attached to the copper plate and the wafer under test.

FIG. 3, step 2 indicates the positioning of the copper plate and the wafer under test into the container. Proper directional positions are assured for the copper plate and the wafer under test where both face each other with the surface of the wafer under test facing the copper plate. The planes of the copper plate and the wafer under test are parallel, the copper plate and the wafer under test are mounted at a suitable distance from each other and from the sidewalls of the container.

FIG. 3, step 3 shows the connecting of the wires (that are connected to the copper plate and the wafer under test) to a dc voltage battery. The copper plate now functions as the anode while the wafer under test functions as the cathode of a two electrode apparatus.

FIG. 3, step 6 indicates the removal of the wafer under test from the container for further analysis.

FIG. 3, step 7 indicates the step of defect analysis on the surface of the wafer. This defect analysis can be performed using a standard optical microscope.

Defect analysis can be performed by Focused Ion Beam (FIB) milling whereby a cross section is obtained of the area that is to be analyzed. This process can be further improved by the addition of a layer of metal, a metal cap, to the surface area that needs to be analyzed prior to the milling operation. The metal ions (of the metal cap) will fill voids and will therefore make the voids in defective contacts or vias more visible.

What has been described is considered to be only one illustrative testing apparatus that is in accordance with the principles of the invention. It is however understood that various and numerous other arrangements may be devised in accordance with and by one skilled in the art whereby these other arrangements remain within the spirit and scope of the invention as defined by the accompanying claims.

What is claimed is:

1. A method for determining defects on the surface of a glassification layer, comprising the steps of:

providing a wafer to be tested for said defects, said wafer containing a glassification layer;

providing a copper plate;

providing a container, whereby sides of said container having a first and a second small surface area and a first and a second large surface area, whereby planes of the first and second small surface areas being parallel, whereby planes of the first and second large surface areas being parallel, said container containing a copper-sulfate solution comprising $CuSO_4$ mixed with $H_2O$;

positioning said wafer to be tested within said container;

positioning said copper plate within said container; and applying a voltage between said wafer to be tested and said copper plate by applying direct current e.m.f. between said wafer and said copper plate for a selected period of time, thereby causing creation of $Cu^{2+}$ ions within said copper-sulfate solution whereby said $Cu^{2+}$ ions are forced to diffuse to the surface of said wafer, causing electroplating of the surface of said wafer, further causing electro-deposition of said $Cu^{2+}$ ions on unprotected parts of the surface of said wafer.

2. The method of claim 1 wherein said container has a cross section in a horizontal plane that is a rectangle, said container further having a height that is essentially equal to a diameter of a largest wafer to be tested.

3. The method of claim 1 wherein said providing a wafer to be tested is:

mounting said wafer inside said container with a plane of said wafer being parallel to a plane of said first small surface area of said container, forming a cathode of a two electrode apparatus, said wafer being attached to a conducting wire;

mounting said wafer such that a surface that is to be tested is submerged within said copper-sulfate solution;

mounting said wafer in relatively close proximity to said first small surface area of said container; and facing said surface that is to be tested toward said second small surface area of said container.

4. The method of claim 1 wherein said providing said copper plate within said container is:

mounting said copper plate inside said container with a plane of said copper plate being parallel to a plane of said second small surface area of said container, forming an anode of a two electrode apparatus, said copper plate being attached to a conducting wire;

mounting said copper plate such that said copper plate is at least partially submerged within said copper-sulfate solution; and mounting said copper plate in relatively close proximity to said second small surface area of said container.

* * * * *